US012660512B2

(12) United States Patent
Huang et al.

(10) Patent No.: US 12,660,512 B2
(45) Date of Patent: Jun. 16, 2026

(54) LOW-MAGNETIC-FIELD GALLIUM ARSENIDE QUANTUM HALL RESISTANCE SAMPLE AND PREPARATION THEREOF

(71) Applicant: Beijing Orient Institute of Measurement and Test, Beijing (CN)

(72) Inventors: Xiaoding Huang, Beijing (CN); Zhongwei Wang, Beijing (CN); Jianzhen Cai, Beijing (CN); Yang Wang, Beijing (CN); Yuqiao Huang, Beijing (CN); Yiping Zeng, Beijing (CN)

(73) Assignee: Beijing Orient Institute of Measurement and Test, Beijing (CN)

( * ) Notice: Subject to any disclaimer, the term of this patent is extended or adjusted under 35 U.S.C. 154(b) by 94 days.

(21) Appl. No.: 18/900,904

(22) Filed: Sep. 30, 2024

(65) Prior Publication Data

US 2026/0101675 A1 Apr. 9, 2026

(30) Foreign Application Priority Data

Oct. 17, 2023 (CN) .......................... 202311339985.6

(51) Int. Cl.
H10N 52/85 (2023.01)
H10N 52/00 (2023.01)
H10N 52/01 (2023.01)

(52) U.S. Cl.
CPC ............. H10N 52/85 (2023.02); H10N 52/01 (2023.02); H10N 52/101 (2023.02)

(58) Field of Classification Search
CPC ............. H10D 84/038; H10D 30/4755; H10D 30/473–4738; H10D 64/27–519; H10D 77/146; H10F 30/2215
See application file for complete search history.

(56) References Cited

U.S. PATENT DOCUMENTS

2005/0099345 A1* 5/2005 von Klitzing ......... H10F 77/146
343/703

* cited by examiner

*Primary Examiner* — Julio J Maldonado
*Assistant Examiner* — Alexander Michael Miller

(57) ABSTRACT

A low-magnetic-field gallium arsenide Quantum Hall Resistance sample can reproduce a Quantum Hall Resistance effect under lower magnetic field conditions, and has a wider plateau width of the quantum resistance sample being equal or greater than 0.6 T, and the magnetic field condition corresponds to the central magnetic field of the plateau being 2 between 7 T and 8 T. The sample includes a GaAs heterojunction material, the GaAs heterojunction material has a seven-layer structure including first to seventh layers sequentially stacked upwards and bonded to a surface of a GaAs substrate. The first layer is a GaAs isolation layer, the second layer is GaAs/AlGaAs superlattice layer, the third layer is high-purity GaAs layer, the fourth layer is a two-dimensional electron gas layer, the fifth layer is an undoped $Al_xGa_{1-x}As$ isolation layer, the sixth layer is a Si-doped $Al_xGa_{1-x}As$ layer, and the seventh layer is a GaAs surface layer.

10 Claims, 3 Drawing Sheets

Removing an oxide layer from the GaAs substrate

Growing the GaAs heterojunction material by a molecular beam epitaxy

Performing lithography on the GaAs heterojunction material to make the GaAs heterojunction material be in a Hall bar shape Removing an oxide layer from the GaAs heterojunction material in the Hall bar shape Depositing an Au/Ge/Ni electrode layer by an electron beam evaporation Performing a rapid thermal annealing to form an ohmic contact Sealing

FIG. 4

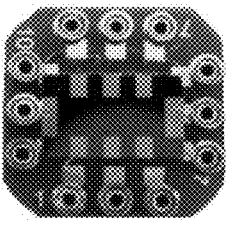

FIG. 5

LOW-MAGNETIC-FIELD GALLIUM ARSENIDE QUANTUM HALL RESISTANCE SAMPLE AND PREPARATION THEREOF

CROSS-REFERENCE TO RELATED APPLICATION

This application claims priority to Chinese Patent Application No. 202311339985.6, filed Oct. 17, 2023, which is herein incorporated by reference in its entirety.

TECHNICAL FIELD

The disclosure relates to the technical field of quantum measurement, and particularly to a low-magnetic-field gallium arsenide Quantum Hall Resistance sample and a preparation thereof.

BACKGROUND

The Quantum Hall Resistance standard achieves the definition of the unit of resistance directly from Planck's constant h and the elementary charge e, featuring high accuracy and invariance over time and location. Compared to the physical resistance standards, the technical indicators have been improved by 2 to 3 orders of magnitude, representing a disruptive measurement technology. The core component of this technology is the Quantum Hall Resistance sample.

Gallium arsenide (GaAs) Quantum Hall Resistance samples are currently the most widely used and reliable quantum resistance standard devices. The resistance value reproduced by a plateau2 (also referred to the second plateau) is 12906.4037 ohms ($\Omega$), which is close to an integer multiple of 10. As shown in FIG. 1, the plateau 2 (i=2) is a quantum resistance plateau widely adopted internationally. However, a central magnetic field of the plateau 2 in the GaAs quantum resistance sample in the related art is usually above 10 tesla (T), which requires very high standards for the winding materials and winding processes of the superconducting magnets. Currently, the superconducting magnets above 9 T and below 9 T use different superconducting wire materials and winding processes, and the cost of the superconducting magnets below 9 T is significantly reduced. However, the GaAs quantum resistance samples may exhibit insufficient quantization when reproducing the quantum Hall effect at too low magnetic fields. Research from several national laboratories indicates that typically more than 7 T is required. Therefore, selecting a quantum resistance sample with a central magnetic field of the plateau 2 between 7 T and 8 T can both reduce the cost of the magnet and ensure adequate quantization.

The current development of quantum resistance samples with the central magnetic field of the plateau 2 of 7 T to 8 T is the direction of effort for scientists from various countries. Theoretically, reducing the doping concentration of silicon (Si) and increasing the thickness of the isolation layer can lower a carrier concentration of the two-dimensional electron gas, thereby reducing the magnetic induction strength required for the quantum resistance sample to reproduce the effect. However, the reduction of the carrier concentration leads to an increase in mobility, causing the quantum resistance plateau to narrow. The quantum resistance sample developed by the physikalisch-technische bundesanstalt (PTB) in Germany, which is below 8 T, has a plateau width of 0.27 T, which is not suitable for resistance metrology standards. The wider width of the Quantum Resistance plateau, the greater the interval of the Landau energy levels of the two-dimensional electron gas, and the more stable the Quantum Hall effect. The plateau width is an important technical indicator to measure the level of quantum resistance samples, a too narrow quantum resistance plateau is not suitable as resistance metrology standards. Therefore, it is necessary to develop quantum resistance samples that can reproduce the quantum Hall effect under lower magnetic field conditions and also have a wider quantum plateau.

SUMMARY

To addresses the existing defects or insufficiencies in the related art, a low-magnetic-field GaAs Quantum Hall Resistance sample and a preparation thereof are provided, which can allow for the reproduction of the Quantum Hall effect under a lower magnetic field condition while also have a wider width of the Quantum Resistance plateau sample, with the width of the Quantum Resistance plateau being equal or greater than 0.6 T, and the magnetic field condition being between 7 T and 8 T at a center of the plateau 2.

The technical solutions of the disclosure are as follows.

A low-magnetic-field GaAs Quantum Hall Resistance sample includes a GaAs heterojunction material. The GaAs heterojunction material has a seven-layer structure including first to seventh layers sequentially stacked upwards and bonded to a surface of a GaAs substrate. The first layer of the seven-layer structure is a GaAs isolation layer, the second layer of the seven-layer structure is gallium arsenide/aluminum gallium arsenide (GaAs/AlGaAs) superlattice layer, the third layer of the seven-layer structure is high-purity GaAs layer, the fourth layer of the seven-layer structure is a two-dimensional electron gas layer, the fifth layer of the seven-layer structure is an undoped $Al_xGa_{1-x}As$ isolation layer, the sixth layer of the seven-layer structure is a Si-doped $Al_xGa_{1-x}As$ layer, where x is in a range of 0.28 to 0.32, and the seventh layer of the seven-layer structure is a GaAs surface layer. A carrier concentration of the two-dimensional electron gas layer is in a range of $3.0 \times 10^{17}/cm^2$ to $3.8 \times 10^{17}/cm^2$, and a carrier mobility of the two-dimensional electron gas layer is in a range of $1.0 \times 10^5 \ cm^2/(V \cdot s)$ to $4.0 \times 10^5 \ cm^2/(V \cdot s)$, to match a carrier concentration of the two-dimensional electron gas layer with an expected low magnetic field of a central magnetic field, which is positively related to the carrier concentration of the two-dimensional electron gas layer, of a Quantum Hall Resistance plateau 2, and also to match the carrier concentration of the two-dimensional electron gas layer with an expected lower limit of a plateau width, which is positively related to the carrier concentration of the two-dimensional electron gas layer, of the Quantum Hall Resistance plateau 2; and the low magnetic field is in a range of 7 tesla (T) to 8 T, and the plateau width of the Quantum Hall Resistance plateau 2 is equal or greater than 0.6 T.

In an embodiment, a thickness of the undoped $Al_xGa_{1-x}As$ isolation layer is in a range of 10 nanometers (nm) to 30 nm.

In an embodiment, the thickness of the undoped $Al_xGa_{1-x}As$ isolation layer is in a range of 15 nm to 20 nm, the central magnetic field of the Quantum Hall Resistance plateau 2 is 7.6 T, and a magnetic field range corresponding to the Quantum Hall Resistance plateau 2 starts from 7.3 T and ends at 7.9 T.

In an embodiment, a thickness of the Si-doped $Al_xGa_{1-x}As$ layer is in a range of 45 nm to 55 nm, a doping concentration of Si in the Si-doped $Al_xGa_{1-x}As$ layer is in a range of $8 \times 10^{17}/cm^3$ to $9 \times 10^{17}/cm^3$, and a thickness of the GaAs surface layer is in a range of 9 nm to 11 nm.

In an embodiment, an impurity concentration of the high-purity GaAs layer is on an order of $10^{13}$/cm$^3$, and a thickness of the high-purity GaAs layer is in a range of 380 nm to 420 nm. The two-dimensional electron gas layer is formed at a contact surface between the high-purity GaAs layer and the undoped Al$_x$Ga$_{1-x}$As isolation layer, and a thickness of the two-dimensional electron gas layer is in a range of 9 nm to 11 nm.

In an embodiment, the GaAs/AlGaAs superlattice layer is configured to isolate impurities in the GaAs isolation layer, the GaAs/AlGaAs superlattice layer includes a structure formed by alternately growing a GaAs material and a AlGaAs material for 20 cycles, and a thickness of the GaAs isolation layer is in a range of 200 nm to 500 nm.

In an embodiment, a resistance value reproduced at the central magnetic field of the Quantum Hall Resistance plateau 2 is 12906.4037 ohms ($\Omega$), and a relative measurement uncertainty is less than $2\times10^{-8}$.

In an embodiment, a periphery of the GaAs surface layer is provided with multiple metal electrodes connected to the GaAs surface layer, a material of each of the multiple metal electrodes is an Au/Ge/Ni alloy, the Au/Ge/Ni alloy forms an ohmic contact with the two-dimensional electron gas layer, and a weight percentage (wt %) ratio of Au:Ge:Ni in the Au/Ge/Ni alloy is 88:8:4; and the multiple metal electrodes includes three pairs of voltage terminals arranged transversely and a pair of current terminals arranged longitudinally.

A preparation method of the low-magnetic-field GaAs Quantum Hall Resistance sample is provided and includes the steps as follows:

step 1, removing an oxide layer from the GaAs substrate to obtain a processed GaAs substrate;

step 2, growing the GaAs heterojunction material on the processed GaAs substrate by a molecular beam epitaxy to obtain a first structure (i.e., including the processed GaAs substrate and the GaAs heterojunction material);

step 3, performing lithography on the GaAs heterojunction material of the first structure to make the GaAs heterojunction material be in a Hall bar shape, thereby obtaining a second structure (i.e., including the processed GaAs substrate and the GaAs heterojunction material in the Hall bar shape);

step 4, removing an oxide layer from the GaAs heterojunction material of the second structure to obtain a third structure (i.e., including the processed GaAs substrate and the GaAs heterojunction material without the oxide layer);

step 5, performing an electron beam evaporation on the GaAs heterojunction material of the third structure to deposit an Au/Ge/Ni electrode layer (i.e., metal electrodes), thereby obtaining a fourth structure (i.e., including the processed GaAs substrate, the GaAs heterojunction material and the metal electrodes);

step 6, performing a rapid thermal annealing on the fourth structure to form an ohmic contact, thereby obtaining a fifth structure; and step 7, sealing the fifth structure to obtain the low-magnetic-field GaAs Quantum Hall Resistance sample.

In an embodiment, the step 1 specifically includes: placing the GaAs substrate in an environment of 575° C. to 585° C. to remove the oxide layer, and determining whether the oxide layer has been removed based on an infrared temperature of the GaAs substrate and changes in a reflection high-energy electron diffraction (RHEED) pattern.

In an embodiment, the step 2 specifically includes: loading the Ga, As, and Al material required for growth of GaAs/AlGaAs into a source furnace, and sequentially growing the GaAs isolation layer, the GaAs/AlGaAs superlattice layer, the high-purity GaAs layer, the undoped Al$_x$Ga$_{1-x}$As isolation layer, the Si-doped Al$_x$Ga$_{1-x}$As layer, and the GaAs surface layer by controlling turning-on and turning off and time of a front baffle of the source furnace; followed by forming the two-dimensional electron gas layer with a thickness of 10 nm at the contact surface between the high-purity GaAs layer and the undoped Al$_x$Ga$_{1-x}$As isolation layer, thereby obtaining the first structure.

In an embodiment, the step 3 specifically includes: performing spin coating, soft baking, exposure, development, etching, and stripping on the GaAs heterojunction material of the first structure to make the GaAs heterojunction material be in the Hall bar shape, thereby to obtain the second structure.

In an embodiment, the step 4 specifically includes: soaking the GaAs heterojunction material in the Hall bar shape (the second structure) in a (NH$_4$)$_2$S saturated solution for 30 seconds to obtain a soaked structure, and then rinsing the soaked structure with deionized water and then drying the rinsed structure to obtain the third structure.

In an embodiment, the step 5 specifically includes: using an electron beam evaporation machine to evaporate Ga/As/Al materials onto the surface of the sample Hall bar (i.e., the surface of the GaAs heterojunction material of the third structure) to obtain the fourth structure.

In an embodiment, the step 6 specifically includes: using a rapid thermal annealing system, maintaining the fourth structure at a temperature environment in a range of 445-455° C. with a protective gas of N$_2$/H$_2$ for a period of time in a range of 4-6 minutes (min), and then rapidly cooling down the fourth structure to form an Au/Ge/Ni alloy, and diffusing down the Au/Ge/Ni alloy to the two-dimensional electron gas layer to form the ohmic contact. The temperature and duration during the rapid thermal annealing of the sample under a protective atmosphere of N$_2$ or H$_2$ are important factors affecting the contact resistance. Conventional methods generally use an annealing temperature in a range of 400 to 430° C. and an annealing time of 20 min. Based on the variation of ferromagnetic properties of nickel (Ni) with temperature, increasing the annealing temperature can reduce the contact resistance. The annealing temperature for the metal electrodes of the low-magnetic-field GaAs Quantum Hall Resistance samples is 445-455° C., and considering the thermal volatility characteristics of As, the annealing time should not be too long. The annealing time for the metal electrodes of the low-magnetic-field GaAs Quantum Hall Resistance samples is 4-6 min.

In an embodiment, the step 7 specifically includes: using a wire bonding machine to connect the metal electrodes to pins through an aluminum wire.

The beneficial effects of the disclosure are as follows.

The low-magnetic-field GaAs Quantum Hall Resistance sample and the preparation method thereof in the disclosure are based on a functional relationship between a magnetic flux density and the carrier concentration to adjust the carrier concentration of the two-dimensional electron gas in the GaAs heterojunction to reduce the central magnetic field of the Quantum Hall Resistance plateau 2 to 7 T-8 T. Combined with the adjustment of thicknesses of the isolation layers, the mobility is controlled within the order of $10^5$, ensuring the quantum resistance plateau width is equal or greater than 0.6 T. The disclosure addresses both the high magnetic field requirements of conventional GaAs quantum resistance samples and the narrow plateau issue of low-magnetic-field quantum resistance samples. It is suitable for use as a metrological standard, which can promote the widespread application of quantum resistance standards. The contact resistance of the quantum resistance samples is less than 10Ω, fully meeting the needs of quantum resistance metrological standards.

The central magnetic field of a Quantum Hall Resistance plateau 2 of traditional GaAs samples is typically above 10 T, which makes the cost of the low-temperature, high-magnetic field system in quantum resistance standards very high. This leads to difficulties in popularizing the use of the Quantum Resistance standard. The disclosure proposes the GaAs Quantum Hall Resistance sample and its preparation method that can reproduce the quantum Hall effect at a low magnetic field below 8 T and achieve a plateau width of being equal or greater than 0.6 T. The structure of the low-magnetic-field GaAs Quantum Hall Resistance sample includes three parts: the GaAs substrate, the GaAs heterojunction material, and the metal electrodes. A structure of the GaAs heterojunction material includes the GaAs surface layer, the Si-doped $Al_xGa_{1-x}As$ layer, the undoped $Al_xGa_{1-x}As$ isolation layer, the two-dimensional electron gas layer, the high-purity GaAs layer, the GaAs/AlGaAs superlattice layer, and the GaAs isolation layer. The metal electrodes include a pair of current terminals and three pairs of voltage terminals.

The key technical features of the disclosure are the carrier concentration, the mobility of the two-dimensional electron gas, and the ohmic contact of the metal electrodes of the Quantum Hall Resistance sample. The carrier concentration depends on the doping concentration of Si and the thickness of the isolation layers, the mobility can be adjusted through the thickness of the isolation layers and the concentration of background impurities, and the ohmic contact of the metal electrodes depends on material of the metal electrodes and the annealing process.

The disclosure reasonably configures the doping concentration of Si and controls the thickness of the isolation layers, thereby reducing the carrier concentration of the two-dimensional electron gas layer without significantly increasing the mobility of the two-dimensional electron gas layer. It achieves the reproduction of the quantum Hall effect at a lower magnetic flux density and has a wider quantum plateau. The disclosure can optimize a ratio of the electrode materials of Au/Ge/Ni alloy for the Quantum Hall Resistance sample and its annealing time, controlling the contact resistance of the metal electrodes of the Quantum Hall Resistance sample to the ohmic level.

In the disclosure, the undoped $Al_xGa_{1-x}As$ isolation layer is used to isolate electrons and impurities from the Si-doped $Al_xGa_{1-x}As$ layer, which can reduce the carrier concentration and scattering of the Quantum Hall Resistance. A value of x, as the content of Al, is in a range of 0.28 to 0.32, with the most preferred value being 0.28, and a non-uniformity of the distribution of the Al is equal or less than 1.5%. In conventional GaAs samples, the thickness of the isolation layer is in a range of 30 nm to 80 nm. According to the functional relationship between the thickness of the isolation layer and the carrier concentration, the carrier concentration is inversely proportional to the thickness of the isolation layer. Increasing the thickness of the isolation layer can reduce the carrier concentration, but it also reduces scattering, thereby increasing the mobility and narrowing the quantum resistance plateau. Therefore, the disclosure controls the thickness of the isolation layer to a smaller value, which is in a range of 10 nm to 30 nm, with a preferred value in a range of 15 nm to 20 nm, and the most preferred is 19 nm.

BRIEF DESCRIPTION OF DRAWINGS

FIG. 4 is a schematic flowchart of the preparation method of the low-magnetic-field GaAs Quantum Hall Resistance sample in the disclosure. The preparation method includes: step 1, removing an oxide layer from the GaAs substrate; step 2, growing the GaAs heterojunction material by a molecular beam epitaxy; step 3, performing lithography on the GaAs heterojunction material to make the GaAs heterojunction material be in a Hall bar shape; step 4, removing an oxide layer from the GaAs heterojunction material in the Hall bar shape; step 5, depositing an Au/Ge/Ni electrode layer by an electron beam evaporation; step 6, performing a rapid thermal annealing to form an ohmic contact; and step 7, sealing.

FIG. 5 is a physical diagram of the low-magnetic-field GaAs Quantum Hall Resistance sample of the disclosure. In FIG. 5, a middle terminal of the three terminals (i.e., pins) on a left side corresponds to the first current terminal 301 in FIG. 3, and the other two terminals on the left side are reserved terminals. In FIG. 5, a middle terminal of the three terminals on a right side corresponds to the fifth current terminal 305 in FIG. 3, and the other two terminals on the right side are reserved terminals. The three terminals on a top side of FIG. 5 correspond from left to right to the voltage terminals 302, 303, and 304 in FIG. 3. The three terminals on a bottom side of FIG. 5 correspond from left to right to the voltage terminals 308, 307, and 306 in FIG. 3. A resistance between the voltage terminals 302 and 308 is the transverse resistance RH, and a resistance between the voltage terminals 302 and 303 is the longitudinal resistance $R_{xx}$.

DETAILED DESCRIPTION OF EMBODIMENTS

The disclosure will be described below in conjunction with the attached drawings (FIGS. 1-5).

Figures 1, 2:
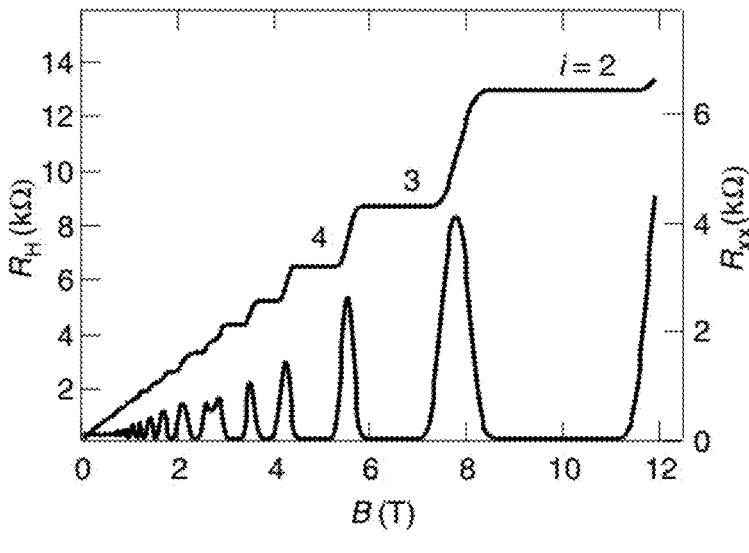
FIG. 1 is a schematic diagram of a quantum Hall effect of the disclosure. A left vertical coordinate in FIG. 1 is a transverse resistance RH (kilo-ohms), with RH corresponding to a stepped ascending curve located above. Here, i=2 represents a plateau 2, and a resistance value RH reproduced on the plateau 2 is 12906.4037 ohms. A longitudinal resistance $R_{xx}$ is zero across wider plateau 2, plateau 3, and plateau 4, with a right vertical coordinate being the longitudinal resistance $R_{xx}$ (kilo-ohms), corresponding to a pulsating curve located below. A horizontal coordinate is a magnetic field B (tesla), with a central magnetic field of the plateau 2 being B=10 T.
FIG. 2 is a structural schematic diagram of a low-magnetic-field GaAs Quantum Hall Resistance sample of the disclosure. The reference numerals in FIG. 2 are as follows: 100—GaAs substrate; 200—GaAs heterojunction material; 201—GaAs surface layer; 202—Si-doped $Al_xGa_{1-x}As$ layer; 203—undoped $Al_xGa_{1-x}As$ isolation layer; 204—two-dimensional electron gas layer; 205—high-purity GaAs layer; 206—GaAs/AlGaAs superlattice layer; 207—GaAs isolation layer; 300—metal electrode.
Figure 3:
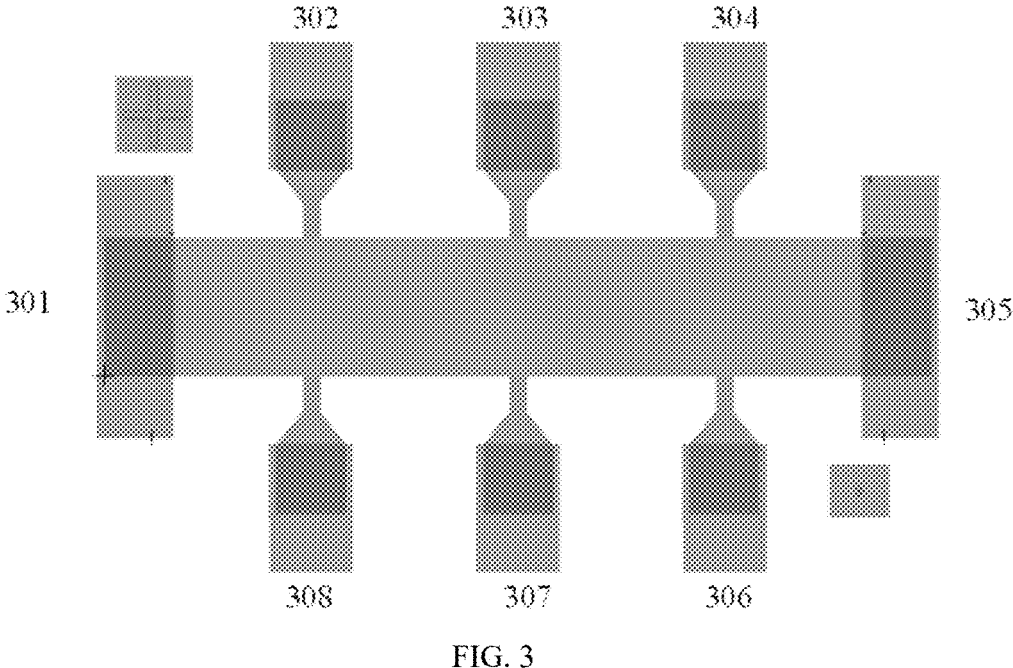
FIG. 3 is a schematic diagram of the Hall bar shape in a preparation method of the low-magnetic-field GaAs Quantum Hall Resistance sample in the disclosure. The reference numerals in FIG. 3 are as follows: 301—first current terminal (paired with fifth current terminal 305); 302—second voltage terminal (paired with eighth voltage terminal 308); 303—third voltage terminal (paired with seventh voltage terminal 307); 304—fourth voltage terminal (paired with sixth voltage terminal 306); 305—the fifth current terminal (paired with the first current terminal 301); 306—the sixth voltage terminal (paired with the fourth voltage terminal 304); 307—the seventh voltage terminal (paired with the third voltage terminal 303); 308—the eighth voltage terminal (paired with the second voltage terminal 302). The first current terminal 301 is connected to an input terminal of a constant current source, and the fifth current terminal 305 is connected to an output terminal of the constant current source, used for outputting a current in a range of 38 microamperes (μA)-77 μA to the low-magnetic-field GaAs Quantum Hall Resistance sample. Any pair of the three pairs of voltage terminals 302-308, 303-307, and 304-306 can observe the quantum Hall effect, the voltage terminals 302, 303, 304 are connected to a high potential terminal of a voltmeter, and the voltage terminals 308, 307, 306 are connected to a low potential terminal of the voltmeter for measuring the Hall voltage of the low-magnetic-field GaAs Quantum Hall Resistance sample.

FIG. 1 is a schematic diagram of a quantum Hall effect of the disclosure. FIG. 2 is a structural schematic diagram of a low-magnetic-field GaAs Quantum Hall Resistance sample of the disclosure. FIG. 3 is a schematic diagram of the Hall bar shape in a preparation method of the low-magnetic-field GaAs Quantum Hall Resistance sample in the disclosure. FIG. 4 is a schematic flowchart of the preparation method of the low-magnetic-field GaAs Quantum Hall Resistance sample in the disclosure. FIG. 5 is a physical diagram of the low-magnetic-field GaAs Quantum Hall Resistance sample of the disclosure. As shown in FIGS. 1-5, the magnetic field GaAs Quantum Hall Resistance sample includes a GaAs heterojunction material 200, and the GaAs heterojunction material 200 has a seven-layer structure including first to seventh layers sequentially stacked upwards and bonded to a surface of a GaAs substrate 100. The first layer of the seven-layer structure is a GaAs isolation layer 207, the second layer of the seven-layer structure is a GaAs/AlGaAs superlattice layer 206, the third layer of the seven-layer structure is a high-purity GaAs layer 205, the fourth layer of the seven-layer structure is a two-dimensional electron gas layer 204, the fifth layer of the seven-layer structure is a undoped $Al_xGa_{1-x}As$ isolation layer 203, the sixth layer of the seven-layer structure is a Si-doped $Al_xGa_{1-x}As$ layer 202, and the seventh layer of the seven-layer structure is a GaAs surface layer 201. A thickness of the undoped $Al_xGa_{1-x}As$ isolation layer 203 is in a range of 10 nm to 30 nm, x is in a range of 0.28 to 0.32, to match a carrier concentration of the two-dimensional electron gas layer 204 with an expected low magnetic field of a central magnetic field, which is positively related to the carrier concentration of the two-dimensional electron gas layer, of a Quantum Hall Resistance plateau 2, and the low magnetic field is in a range of 7 T to 8 T, also to match the carrier concentration of the two-dimensional electron gas layer 204 with an expected lower limit of a plateau width, which is positively related to the carrier concentration of the two-dimensional electron gas layer, of the Quantum Hall Resistance plateau 2, and the plateau width of the Quantum Hall Resistance plateau 2 is equal or greater than 0.6 T.

In an embodiment, the thickness of the undoped $Al_xGa_{1-x}As$ isolation layer 203 is in a range of 15 nm to 20 nm, the central magnetic field of the Quantum Hall Resistance plateau 2 is 7.6 T, and a magnetic field range corresponding to the Quantum Hall Resistance plateau 2 starts from 7.3 T and ends at 7.9 T. A resistance value reproduced at the central magnetic field of the Quantum Hall Resistance plateau 2 is 12906.4037Ω, and a relative measurement uncertainty is less than $2\times10^{-8}$.

In an embodiment, an impurity concentration of the high-purity GaAs layer 205 is on an order of $10^{13}/cm^3$, and a thickness of the high-purity GaAs layer 205 is in a range of 380 nm to 420 nm. The two-dimensional electron gas layer 204 is formed at a contact surface between the high-purity GaAs layer 205 and the undoped $Al_xGa_{1-x}As$ isolation layer 203, a thickness of the two-dimensional electron gas layer 204 is in a range of 9 nm to 11 nm, the carrier concentration of the two-dimensional electron gas layer 204 is in a range of $3.0\times10^{17}/cm^2$ to $3.8\times10^{17}/cm^2$, and a carrier mobility of the two-dimensional electron gas layer 204 is in a range of $1.0\times10^5$ $cm^2/(V\cdot s)$ to $4.0\times10^5$ $cm^2/(V\cdot s)$.

In an embodiment, the GaAs/AlGaAs superlattice layer 206 is configured to isolate impurities in the GaAs isolation layer 207, the GaAs/AlGaAs superlattice layer 206 includes a structure formed by alternately growing a GaAs material and a AlGaAs material for 20 cycles, and a thickness of the GaAs isolation layer 207 is in a range of 200 nm to 500 nm. A thickness of the Si-doped $Al_xGa_{1-x}As$ layer 202 is in a range of 45 nm to 55 nm, a doping concentration of Si in the Si-doped $Al_xGa_{1-x}As$ layer 202 is in a range of $8\times10^{17}/cm^3$ to $9\times10^{17}/cm^3$, and a thickness of the GaAs surface layer 201 is in a range of 9 nm to 11 nm. A periphery of the GaAs surface layer 201 is provided with multiple metal electrodes 300 connected to the GaAs surface layer, a material of each of the multiple metal electrodes 300 is an Au/Ge/Ni alloy, the Au/Ge/Ni alloy forms an ohmic contact with the two-dimensional electron gas layer 204, and a weight percentage (wt %) ratio of Au:Ge:Ni in the Au/Ge/Ni alloy is 88:8:4, the multiple metal electrodes 300 includes three pairs of voltage terminals (including the pair of a second voltage terminal 302 and a eighth voltage terminal 308, the pair of a third voltage terminal 303 and a seventh voltage terminal 307, and the pair of a fourth voltage terminal 304 and a sixth voltage terminal 306) arranged transversely and a pair of current terminals (including the pair of a first current terminal 301 and a fifth current terminal 305) arranged longitudinally.

In an embodiment, a preparation method of the low-magnetic-field GaAs Quantum Hall Resistance sample includes steps as follows.

Step 1, an oxide layer is removed from the GaAs substrate to obtain a processed GaAs substrate. Step 2, the GaAs heterojunction material is grown on the processed GaAs substrate by a molecular beam epitaxy to obtain a first structure. Step 3, lithography is performed on the GaAs heterojunction material of the first structure to make the GaAs heterojunction material be in a Hall bar shape, thereby obtaining a second structure. Step 4, an oxide layer is removed from the GaAs heterojunction material of the second structure to obtain a third structure. Step 5, an electron beam evaporation is performed on the GaAs heterojunction material of the third structure to deposit an Au/Ge/Ni electrode layer, thereby obtaining a fourth structure. Step 6, a rapid thermal annealing is performed on the fourth structure to form an ohmic contact, thereby obtaining a fifth structure. Step 7, the fifth structure is sealed to obtain the low-magnetic-field GaAs Quantum Hall Resistance sample.

In an embodiment, the step 1 specifically includes that the GaAs substrate is placed in an environment of 580° C. to remove the oxide layer, and whether the oxide layer has been removed is determined based on an infrared temperature of the GaAs substrate and changes in a RHEED pattern. The step 2 specifically includes that Ga, As, and Al materials required for growth of GaAs/AlGaAs are loaded into a source furnace, and the GaAs isolation layer, the GaAs/AlGaAs superlattice layer, the high-purity GaAs layer, the undoped $Al_xGa_{1-x}As$ isolation layer, the Si-doped $Al_xGa_{1-x}As$ layer, and the GaAs surface layer are sequentially grown by controlling turning-on and turning-off and time of a front baffle of the source furnace. The two-dimensional electron gas layer with 10 nm is formed at a contact surface between the high-purity GaAs layer and the undoped $Al_xGa_{1-x}As$ isolation layer. The step 3 specifically includes that spin coating, soft baking, exposure, development, etching, and stripping are performed on the GaAs heterojunction material to make the GaAs heterojunction material be in the Hall bar shape.

The step 4 specifically includes that the GaAs heterojunction material in the Hall bar shape is soaked in a $(NH_4)_2S$ saturated solution for 30 seconds, and then rinsed with deionized water and dried. The step 5 specifically includes that an electron beam evaporation machine is used to deposit the three materials of Au, Ge, and Ni onto a surface of the of the sample Hall bar. The step 6 specifically includes that a rapid thermal annealing system is used, a temperature environment is maintained with a protective gas of $N_2/H_2$, and followed by rapidly cooling down to form an Au/Ge/Ni alloy, then the Au/Ge/Ni alloy is diffused down to the two-dimensional electron gas layer to form the ohmic contact. The step 7 specifically includes that a wire bonding machine is used to connect metal electrodes to pins through an aluminum wire.

In an embodiment, the structure of the low-magnetic-field GaAs Quantum Hall Resistance sample includes three parts: the GaAs substrate, the GaAs heterojunction material, and the metal electrodes.

As shown in FIG. 2, a structure of the GaAs heterojunction material includes the GaAs surface layer 201, the Si-doped $Al_xGa_{1-x}As$ layer 202, the undoped $Al_xGa_{1-x}As$ isolation layer 203, the two-dimensional electron gas layer 204, the high-purity GaAs layer 205, the GaAs/AlGaAs superlattice layer 206, and the GaAs isolation layer 207.

The thickness of the GaAs surface layer 201 is 10 nm, which can prevent the formation of strong surface states due to oxidation of the sample surface, facilitating the growth of metal electrode materials.

The thickness of the Si-doped $Al_xGa_{1-x}As$ layer 202 is 50 nm. In conventional GaAs samples, the doping concentration of Si is $10^{18}/cm^3$. According to a functional relationship between a carrier concentration and a doping concentration, the carrier concentration is directly proportional to the doping concentration. Reducing the doping concentration can lower the carrier concentration. Therefore, in the disclosure, the doping concentration of the Si is in a range of $8×10^{17}/cm^3$ to $9×10^{17}/cm^3$, with an optimal being $8×10^{17}/cm^3$. A content x of Al affects a band structure of the multi-element semiconductor material. Based on calculation formulas for a bandgap width and a lattice constant according to the value x of Al, the Al content x is in a range of 0.28-0.32, with an optimal being 0.28, and an non-uniformity of Al distribution is equal or less than 1.5%.

The undoped $Al_xGa_{1-x}As$ isolation layer 203 is used to isolate electrons and impurities from the Si-doped $Al_xGa_{1-x}As$ layer 202, which can reduce the carrier concentration and scattering of the sample. The Al content x is in a range of 0.28-0.32, with the optimal being 0.28, and the non-uniformity of Al distribution is equal or less than 1.5%. In conventional GaAs samples, the thickness of the isolation layer is in a range of 30 nm-80 nm. According to a functional relationship between the thickness of the isolation layer and the carrier concentration, the carrier concentration is inversely proportional to the thickness of the isolation layer. Increasing the thickness of the isolation layer can reduce the carrier concentration, but it also reduces scattering, thereby increasing the mobility and narrowing the quantum resistance plateau. Therefore, in the disclosure, the thickness of the isolation layer is controlled to a smaller value, with a range of 10 nm-30 nm, preferably 15 nm-20 nm, and an optimal is 19 nm.

Under conditions of an ultra-low temperature and a strong magnetic field, the energy levels of the two-dimensional electron gas in the two-dimensional electron gas layer 204, become quantized, forming Landau levels and exhibiting the quantum Hall effect. According to a functional relationship between the central magnetic field of the quantum resistance plateau and the carrier concentration, an external magnetic field is directly proportional to the carrier concentration. To develop GaAs Quantum Hall Resistance samples under low magnetic field conditions, it is necessary to reduce the carrier concentration of the two-dimensional electron gas. However, the carrier concentration is negatively correlated with the mobility, and the mobility is also negatively correlated with the width of the quantum resistance plateau. Therefore, reducing the carrier concentration will also cause a decrease in the width of the quantum resistance plateau. It is essential to reasonably control the ranges of the carrier concentration and the mobility. The carrier concentration of the two-dimensional electron gas layer is in a range of $3.0×10^{17}/cm^2$ to $3.8×10^{17}/cm^2$, a central magnetic field of the corresponding Quantum Hall Resistance plateau 2 in a range of 7 T to 8 T, a carrier mobility of the two-dimensional electron gas layer is in a range of $1.0×10^5$ $cm^2/(V·s)$ to $4.0×10^5$ $cm^2/(V·s)$, and the corresponding plateau width is equal or greater than 0.6 T.

The thickness of the high-purity GaAs layer 205 is 400 nm. The quality of the GaAs Quantum Hall Resistance sample depends on the material of the two-dimensional electron gas layer, and the material performance of the two-dimensional electron gas layer relies on the basic GaAs material, especially a purity of the GaAs material. The GaAs material grown by the molecular beam epitaxy typically has an impurity concentration in the order of $1014/cm^3$. To obtain high-quality two-dimensional electron gas and improve the accuracy of the quantum Hall effect, the impurity concentration in the high-purity GaAs layer of the low-magnetic-field Quantum Hall Resistance sample is $10^{13}/cm^3$ (a number of impurity atoms of one cubic centimeter). Therefore, the low-magnetic-field Quantum Hall Resistance sample also includes the GaAs/AlGaAs superlattice layer 206 and the GaAs isolation layer 207, both of which are used to reduce the impurity concentration in the high-purity GaAs layer 205.

The GaAs/AlGaAs superlattice layer 206 is configured to isolate the impurities of the GaAs isolation layer 207, and a structure of the GaAs/AlGaAs superlattice layer 206 is formed by alternately growing a GaAs material and a AlGaAs material for 20 cycles.

The GaAs isolation layer 207 is configured to facilitate the growth and transfer of the sample, the GaAs heterojunction material is grown on a commercial GaAs substrate. However, the surface of the commercial GaAs substrate has many defects and impurities. In order to isolate the impurities and improve the purity of the high-purity GaAs layer 205, the thickness of the GaAs isolation layer 207 is in a range of 200-500 nm, with a preferred thickness of 200 nm.

As shown in FIG. 3, the GaAs heterojunction material is grown on the commercial GaAs substrate. The GaAs material is shaped into a Hall bar shape using the lithography, and multiple metal electrodes are fabricated to facilitate the soldering of leads for testing. The multiple metal electrodes 300 include a pair of current terminals 301, 305, and three pairs of voltage terminals 302-308, 303-307, and 304-306.

The materials of multiple metal electrodes use an alloy of Au/Ge/Ni, where Au, Ge, and Ni materials are sputtered onto the surface of the GaAs heterojunction material using the electron beam evaporation. The sample is then rapidly annealed under a protective atmosphere of $N_2/H_2$, causing the Au, Ge, and Ni materials to form an alloy and deposit downward to the two-dimensional electron gas layer, thereby creating an ohmic contact.

The weight percentage of the Au/Ge/Ni alloy in the multiple metal electrodes is one of the main factors affecting the contact resistance of the multiple metal electrodes. In conventional methods, the weight percentage of Au/Ge/Ni is set to 85 wt %: 10 wt %: 5 wt %. Considering the impact of ferromagnetic properties of the Ni on the contact resistance, the weight percentage of Au/Ge/Ni in the multiple metal electrodes of the low-magnetic-field GaAs Quantum Hall Resistance samples is 88 wt %: 8 wt %: 4 wt %.

The temperature and duration during the rapid thermal annealing of the sample under the protective atmosphere of $N_2/H_2$ are important factors affecting the contact resistance. Conventional methods generally use an annealing thermal temperature in a range of 400° C.-430° C. and an annealing time of 20 min. Based on the variation of the ferromagnetic properties of Ni with temperature, increasing the annealing temperature can reduce the contact resistance. The annealing temperature for the multiple metal electrodes of the low-magnetic-field GaAs Quantum Hall Resistance samples is 450° C. Considering a thermal volatility of As, the annealing time should not be too long. The annealing time for the multiple metal electrodes of the low-magnetic-field GaAs Quantum Hall Resistance samples is 5 min.

The first current terminal 301 is connected to an input terminal of a constant current source, and the fifth current terminal 305 is connected to an output terminal of the constant current source, and the constant current source is used to apply a current in a range of 38-77 μA to the low-magnetic-field GaAs Quantum Hall Resistance sample.

Any one of the three pairs of voltage terminals 302-308, 303-307, and 304-306 can be used to observe the quantum Hall effect. The voltage terminals 302, 303, and 304 are connected to a high potential terminal of the voltmeter, and the voltage terminals 308, 307, and 306 are connected to a low potential terminal of the voltmeter to measure the Hall voltage of the low-magnetic-field GaAs Quantum Hall Resistance sample.

A preparation method of the low-magnetic-field GaAs Quantum Hall Resistance sample includes steps as follows.

Step 1, an oxide layer is removed from the GaAs substrate. Specifically, the GaAs substrate is placed in an environment of 580° C. to remove the oxide layer, and whether the oxide layer has been removed is determined based on an infrared temperature of the GaAs substrate and changes in a RHEED pattern.

Step 2, the GaAs heterojunction material is grown by a molecular beam epitaxy. Specifically, Ga, As, and Al materials required for growth of GaAs/AlGaAs are loaded into a source furnace, and the GaAs isolation layer, the GaAs/AlGaAs superlattice layer, the high-purity GaAs layer, the undoped $Al_xGa_{1-x}As$ isolation layer, the Si-doped $Al_xGa_{1-x}As$ layer, and the GaAs surface layer are sequentially grown by controlling turning-on and turning-off and time of a front baffle of the source furnace. The two-dimensional electron gas layer with a thickness of 10 nm is formed at a contact surface between the high-purity GaAs layer and the undoped $Al_xGa_{1-x}As$ isolation layer.

Step 3, lithography is performed on the GaAs heterojunction material to make the GaAs heterojunction material be in a Hall bar shape. Specifically, spin coating, soft baking, exposure, development, etching, and stripping are performed on the GaAs heterojunction material to make the GaAs heterojunction material be in the Hall bar shape as shown in FIG. 3.

Step 4, an oxide layer is removed from the GaAs heterojunction material in the Hall bar shape. Specifically, the GaAs heterojunction material in the Hall bar shape is soaked in a $(NH_4)_2S$ saturated solution for 30 seconds, and then rinsed with deionized water and dried, followed by fabricating multiple metal electrodes.

Step 5, an Au/Ge/Ni electrode layer is deposited by an electron beam evaporation. Specifically, an electron beam evaporation machine is used to deposit the three materials of Au, Ge, and Ni onto a surface of the of the sample Hall bar.

Step 6, a rapid thermal annealing is performed to form an ohmic contact. Specifically, a rapid thermal annealing system is used, the sample is maintained in a high temperature environment with a protective gas of $N_2/H_2$ for a period, and followed by rapidly cooling down to form an Au/Ge/Ni alloy, then the Au/Ge/Ni alloy is diffused down to the two-dimensional electron gas layer to form the ohmic contact.

Step 7, sealing. Specifically, the GaAs sample grown is welded to a sample holder using the TO-8 coaxial packaging method (TO-8 is the specification for GaAs Quantum Hall Resistance samples). A wire bonding machine is used to connect the metal electrodes of the sample to the pins of the TO-8 with aluminum wires, thereby obtaining the low-magnetic-field GaAs Quantum Hall Resistance sample.

The resistance value reproduced at the central magnetic field of the low-magnetic-field GaAs Quantum Hall Resistance sample is 12906.4037Ω, and a relative measurement uncertainty is less than $2 \times 10^{-8}$.

The central magnetic field of the plateau 2 of the low-magnetic-field GaAs Quantum Hall Resistance sample is in the range of 7 T to 8 T, and the width of the plateau is equal or greater than 0.6 T.

The ohmic resistance of the multiple metal electrodes of the low-magnetic-field GaAs Quantum Hall Resistance sample is within the ohmic range.

The prepared sample has an isolation layer with the thickness of 19 nm, a doping concentration of $8 \times 10^{17}$ cm³, a carrier concentration of the two-dimensional electron layer of $3.797 \times 10^{17}$ cm², and a mobility of $1.86 \times 10^5$ cm²/(V·s).

The central magnetic field test results are shown in table 1 as follows.

TABLE 1

| Number | Test project | Test result |
|---|---|---|
| 1 | Reproduce resistance value | 12906.4037 Ω |
| 2 | Starting magnetic field of plateau 2 | 7.3 T |
| 3 | Ending magnetic field of plateau 2 | 7.9 T |
| 4 | Central magnetic field of plateau 2 | 7.6 T |
| 5 | Plateau width | 0.6 T |

Contact resistance test results are shown in table 2 as follows.

TABLE 2

| Pin | Contact resistance |
|-----|--------------------|
| 1 | 0.6 Ω |
| 2 | 0.8 Ω |
| 3 | 1.5 Ω |
| 7 | 1 Ω |
| 8 | 0.9 Ω |
| 9 | 1.1 Ω |

It should be noted that the above description is helpful for those skilled in the art to understand the disclosure, but does not limit the scope of protection of the disclosure. Any equivalent substitution, modification, improvement, and/or simplification of the above description that does not depart from the essence of the disclosure falls within the scope of protection of the disclosure.

What is claimed is:

1. A low-magnetic-field gallium arsenide (GaAs) Quantum Hall Resistance sample, comprising:

a GaAs heterojunction material, wherein the GaAs heterojunction material has a seven-layer structure including first to seventh layers sequentially stacked upwards and bonded to a surface of a GaAs substrate;

wherein the first layer of the seven-layer structure is a GaAs isolation layer, the second layer of the seven-layer structure is gallium arsenide/aluminum gallium arsenide (GaAs/AlGaAs) superlattice layer, the third layer of the seven-layer structure is high-purity GaAs layer, the fourth layer of the seven-layer structure is a two-dimensional electron gas layer, the fifth layer of the seven-layer structure is an undoped $Al_xGa_{1-x}As$ isolation layer, the sixth layer of the seven-layer structure is a Si-doped $Al_xGa_{1-x}As$ layer, and the seventh layer of the seven-layer structure is a GaAs surface layer, and wherein a thickness of the undoped $Al_xGa_{1-x}As$ isolation layer is in a range of 10 nanometers (nm) to 30 nm, and x is in a range of 0.28 to 0.32, to match a carrier concentration of the two-dimensional electron gas layer with an expected low magnetic field of a central magnetic field, which is positively related to the carrier concentration of the two-dimensional electron gas layer, of a Quantum Hall Resistance plateau 2, and also to match the carrier concentration of the two-dimensional electron gas layer with an expected lower limit of a plateau width, which is positively related to the carrier concentration of the two-dimensional electron gas layer, of the Quantum Hall Resistance plateau 2;

and the low magnetic field is in a range of 7 tesla (T) to 8 T, and the plateau width of the Quantum Hall Resistance plateau 2 is equal or greater than 0.6 T.

2. The low-magnetic-field GaAs Quantum Hall Resistance sample as claimed in claim 1, wherein the thickness of the undoped $Al_xGa_{1-x}As$ isolation layer is in a range of 15 nm to 20 nm, the central magnetic field of the Quantum Hall Resistance plateau 2 is 7.6 T, and a magnetic field range corresponding to the Quantum Hall Resistance plateau 2 starts from 7.3 T and ends at 7.9 T.

3. The low-magnetic-field GaAs Quantum Hall Resistance sample as claimed in claim 1, wherein a resistance value reproduced at the central magnetic field of the Quantum Hall Resistance plateau 2 is 12906.4037 ohms (Ω), and a relative measurement uncertainty is less than $2 \times 10^{-8}$.

4. The low-magnetic-field GaAs Quantum Hall Resistance sample as claimed in claim 1, wherein an impurity concentration of the high-purity GaAs layer is on an order of $10^{13}$ per cubic centimeter ($10^{13}/cm^3$), and a thickness of the high-purity GaAs layer is in a range of 380 nm to 420 nm; the two-dimensional electron gas layer is formed at a contact surface between the high-purity GaAs layer and the undoped $Al_xGa_{1-x}As$ isolation layer, a thickness of the two-dimensional electron gas layer is in a range of 9 nm to 11 nm, the carrier concentration of the two-dimensional electron gas layer is in a range of $3.0 \times 10^{17}/cm^2$ to $3.8 \times 10^{17}/cm^2$, and a carrier mobility of the two-dimensional electron gas layer is in a range of $1.0 \times 10^5$ $cm^2/(V·s)$ to $4.0 \times 10^5$ $cm^2/(V·s)$.

5. The low-magnetic-field GaAs Quantum Hall Resistance sample as claimed in claim 1, wherein the GaAs/AlGaAs superlattice layer is configured to isolate impurities in the GaAs isolation layer, the GaAs/AlGaAs superlattice layer comprises a structure formed by alternately growing a GaAs material and a AlGaAs material for 20 cycles, and a thickness of the GaAs isolation layer is in a range of 200 nm to 500 nm.

6. The low-magnetic-field GaAs Quantum Hall Resistance sample as claimed in claim 1, wherein a thickness of the Si-doped $Al_xGa_{1-x}As$ layer is in a range of 45 nm to 55 nm, a doping concentration of Si in the Si-doped $Al_xGa_{1-x}As$ layer is in a range of $8 \times 10^{17}/cm^3$ to $9 \times 10^{17}/cm^3$, and a thickness of the GaAs surface layer is in a range of 9 nm to 11 nm.

7. The low-magnetic-field GaAs Quantum Hall Resistance sample as claimed in claim 1, wherein a periphery of the GaAs surface layer is provided with a plurality of metal electrodes connected to the GaAs surface layer, a material of each of the plurality of metal electrodes is an Au/Ge/Ni alloy, the Au/Ge/Ni alloy forms an ohmic contact with the two-dimensional electron gas layer, and a weight percentage (wt %) ratio of Au:Ge:Ni in the Au/Ge/Ni alloy is 88:8:4; and the plurality of metal electrodes comprises three pairs of voltage terminals arranged transversely and a pair of current terminals arranged longitudinally.

8. A preparation method of the low-magnetic-field GaAs Quantum Hall Resistance sample as claimed in claim 1, comprising:

step 1, removing an oxide layer from the GaAs substrate;

step 2, growing the GaAs heterojunction material by a molecular beam epitaxy;

step 3, performing lithography on the GaAs heterojunction material to make the GaAs heterojunction material be in a Hall bar shape;

step 4, removing an oxide layer from the GaAs heterojunction material in the Hall bar shape;

step 5, depositing an Au/Ge/Ni electrode layer by an electron beam evaporation;

step 6, performing a rapid thermal annealing to form an ohmic contact; and step 7, sealing.

9. The preparation method as claimed in claim 8, wherein the step 1 specifically comprises:

placing the GaAs substrate in an environment of 580° C. to remove the oxide layer, and determining whether the oxide layer has been removed based on an infrared temperature of the GaAs substrate and changes in a reflection high-energy electron diffraction (RHEED) pattern.

10. The preparation method as claimed in claim 8, wherein the step 2 specifically comprises: loading Ga, As, and Al materials required for growth of GaAs/AlGaAs into a source furnace, and sequentially growing the GaAs isolation layer, the GaAs/AlGaAs superlattice layer, the high-purity GaAs layer, the undoped $Al_xGa_{1-x}As$ isolation layer, the Si-doped $Al_xGa_{1-x}As$ layer, and the GaAs surface layer by controlling turning-on and turning-off and time of a front baffle of the source furnace; wherein the two-dimensional electron gas layer with a thickness of 10 nm is formed at an contact surface between the high-purity GaAs layer and the undoped $Al_xGa_{1-x}As$ isolation layer;

wherein the step 3 specifically comprises: performing spin coating, soft baking, exposure, development, etching, and stripping on the GaAs heterojunction material to make the GaAs heterojunction material be in the Hall bar shape;

wherein the step 4 specifically comprises: soaking the GaAs heterojunction material in the Hall bar shape in a $(NH_4)_2S$ saturated solution for 30 seconds, and then rinsing with deionized water and drying;

wherein the step 6 specifically comprises: using a rapid thermal annealing system, maintaining at a temperature environment of 445-455° C. with a protective gas of $N_2/H_2$ for 4-6 minutes (min), and then rapidly cooling down to form an Au/Ge/Ni alloy, and diffusing down the Au/Ge/Ni alloy to the two-dimensional electron gas layer to form the ohmic contact; and wherein the step 7 specifically comprises: using a wire bonding machine to connect metal electrodes to pins through an aluminum wire.

* * * * *